(12) United States Patent
Park et al.

(10) Patent No.: US 8,772,074 B2
(45) Date of Patent: Jul. 8, 2014

(54) ORGANIC LIGHT EMITTING DISPLAY AND MANUFACTURING METHOD OF THE SAME

(75) Inventors: Jaehee Park, Gumi-si (KR); Heeseok Yang, Hwaseong-si (KR); Howon Choi, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 82 days.

(21) Appl. No.: 12/461,476

(22) Filed: Aug. 12, 2009

(65) Prior Publication Data

US 2010/0038643 A1 Feb. 18, 2010

(30) Foreign Application Priority Data

Aug. 13, 2008 (KR) ........................ 10-2008-0079450

(51) Int. Cl.
*H01L 21/00* (2006.01)

(52) U.S. Cl.
USPC ............. 438/82; 257/40; 257/59; 257/69; 257/72; 257/E27.001; 257/E27.132; 257/E27.116; 257/E51.005; 257/E21.053; 438/34; 438/99; 349/42; 349/43; 349/46; 349/47; 349/56; 345/92; 345/695

(58) Field of Classification Search
CPC . H01L 27/1214; H01L 27/3244; H01L 51/56; H01L 27/3246; H01L 27/3258; H01L 27/3248; H01L 27/3276; H01L 51/5203; H01L 51/5206; H01L 51/5234; H01L 21/32136; H01L 2924/12044
USPC ............. 257/59, 72, 40, E33.061, E51.018, 257/E21.158, 642, 643, 759, 69, E27.001, 257/E27.13, E27.132, E51.001, E51.005, 257/E21.053, E27.111, E27.116, E27.117; 438/28, 29, 34, 82, 99; 349/42, 43, 46, 349/47, 56, FOR. 111; 345/695, 92
See application file for complete search history.

(56) References Cited

U.S. PATENT DOCUMENTS

| | | | | |
|---|---|---|---|---|
| 5,312,529 | A * | 5/1994 | Antonelli et al. | 204/486 |
| 6,501,227 | B1 * | 12/2002 | Koyama | 315/169.3 |
| 2002/0066902 | A1 * | 6/2002 | Takatoku | 257/72 |
| 2002/0100959 | A1 * | 8/2002 | Joo et al. | 257/532 |
| 2003/0080338 | A1 | 5/2003 | Yamazaki et al. | |
| 2003/0137242 | A1 | 7/2003 | Seki et al. | |
| 2003/0146439 | A1 * | 8/2003 | Yamazaki et al. | 257/79 |
| 2005/0035710 | A1 | 2/2005 | Tanase et al. | |
| 2005/0156520 | A1 | 7/2005 | Tanaka et al. | |
| 2005/0249974 | A1 * | 11/2005 | Mori et al. | 428/690 |
| 2005/0277222 | A1 | 12/2005 | Han et al. | |
| 2006/0138942 | A1 | 6/2006 | Bang et al. | |

(Continued)

FOREIGN PATENT DOCUMENTS

| | | | |
|---|---|---|---|
| CN | 1499643 A | 5/2004 | |
| KR | 960011247 B1 | 8/1996 | |
| KR | 10-2007-0079926 A | 8/2007 | |
| WO | WO 2007129874 A1 * | 11/2007 | H05B 33/10 |

*Primary Examiner* — Meiya Li
(74) *Attorney, Agent, or Firm* — McKenna Long & Aldridge LLP

(57) ABSTRACT

Provided are an organic light emitting display device and a method for manufacturing the same. The organic light emitting display device comprises a transistor on a substrate, a cathode on the transistor and connected to a source or a drain of the transistor, a bank layer on the cathode and having an opening, a metal buffer layer on the cathode, an organic light emitting layer on the metal buffer layer, and an anode on the organic light emitting layer.

1 Claim, 6 Drawing Sheets

(56) References Cited

U.S. PATENT DOCUMENTS

| | | |
|---|---|---|
| 2007/0046196 A1 | 3/2007 | Seo et al. |
| 2008/0074044 A1 | 3/2008 | Huang et al. |
| 2008/0211394 A1* | 9/2008 | Koshihara et al. ............ 313/504 |
| 2008/0290343 A1 | 11/2008 | Lee et al. |

* cited by examiner

ORGANIC LIGHT EMITTING DISPLAY AND MANUFACTURING METHOD OF THE SAME

This application claims the benefit of Korean Patent Application No. 10-2008-0079450 filed on Aug. 13, 2008, which is hereby incorporated by reference.

BACKGROUND

1. Field

This document relates to an organic light emitting display device and a method of manufacturing the same.

2. Related Art

An organic light emitting element used in an organic light emitting display device was a self emissive element including an emission layer disposed between two electrodes formed on a substrate.

The organic light emitting display device is classified into a top-emission type, a bottom-emission type, and a dual-emission type according to a light emission direction. The organic light emitting display device is also classified into a passive matrix type and an active matrix type according to a driving method.

The organic light emitting display device selects one from a plurality of subpixels arranged in matrix and controls the selected pixel to emit light by applying a scan signal, a data signal, and power to the plurality of subpixels arranged in matrix, thereby displaying images.

Each of the subpixels includes a transistor on a substrate and an organic light emitting diode disposed on the transistor. The organic light emitting diode is classified into a normal type organic light emitting diode and an inverted type organic light emitting diode. In the normal type organic light emitting diode, an anode, an organic light emitting layer, and a cathode are sequentially are formed on a transistor. In the inverted type organic light emitting diode, a cathode, an organic light emitting layer, and an anode are sequentially formed on a transistor.

An organic light emitting display device according to the related art includes the inverted type organic light emitting diode. Such an organic light emitting display device has a problem that reliability and life-span of elements deteriorates because an interface of a cathode is oxidized when an electrode of the cathode is deposited. The organic light emitting display device according to the related art also has another problem that electron injection efficiency decreases due to the oxidation of the cathode. Therefore, it needed to be improved.

SUMMARY

An aspect of this document is to provide an organic light emitting display device and a manufacturing method of the same.

In an aspect, an organic light emitting display includes a transistor, a cathode, a bank layer, a metal buffer layer, an organic light emitting layer, and an anode. The transistor is formed on a substrate. The cathode is formed on the transistor and connected to a source of a drain of the transistor. The bank layer is formed on the cathode and includes an opening. The organic light emitting layer is formed on the metal buffer layer, and the anode is formed on the organic light emitting layer.

In a further aspect, a method for manufacturing an organic light emitting display device, including: forming a transistor on a substrate; forming a cathode on the transistor to be connected to a source or a drain of the transistor; forming a bank layer having an opening on the cathode; performing plasma pretreatment on the cathode; forming a metal buffer layer on the cathode; forming an organic light emitting layer on the metal buffer layer; and forming an anode on the organic light emitting layer.

BRIEF DESCRIPTION OF THE DRAWINGS

The implementation of this document will be described in detail with reference to the following drawings in which like numerals refer to like elements.

DETAILED DESCRIPTION

Reference will now be made in detail to embodiments of the invention examples of which are illustrated in the accompanying drawings.

Figure 1:
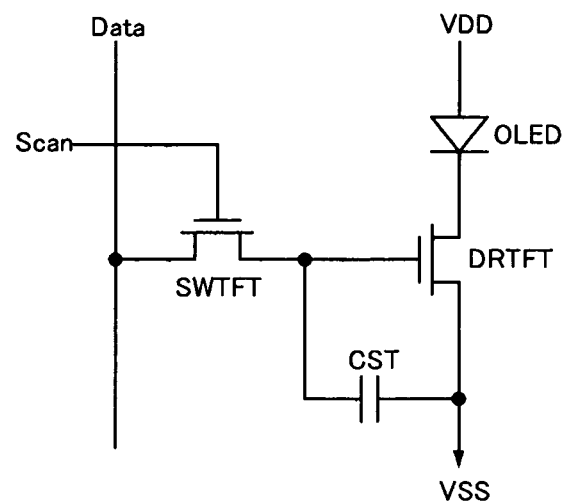
FIG. 1 is a diagram illustrating a sub pixel circuit of an organic light emitting display device according to an exemplary embodiment of the present invention.

Referring to FIG. 1, a subpixel may include a switching transistor SWTFT having a gate connected to a scan line Scan and one end connected to a data line Data. Also, the subpixel may include a driving transistor DRTFT having a gate connected to the other end of the switching transistor and one end connected to a second power line VSS. Also, the subpixel may include a capacitor CST connected between the gate of the driving transistor DRTFT and the second power line VSS. Furthermore, the subpixel may include an organic light emitting diode (OLED) having an anode connected to a first power line VDD and a cathode connected to the other end of the driving transistor DRTFT.

For example, in the organic light emitting display device according to the present embodiment, N type transistors are used as the switching transistor SWTFT and the driving transistor DRTFT in a subpixel.

Such a subpixel structure enables current applied to the first power line VDD to pass through the second power line VSS when the data driver and the scan driver apply a data signal and a scan signal. Accordingly, the OLED emits light, thereby displaying images.

Figure 2:
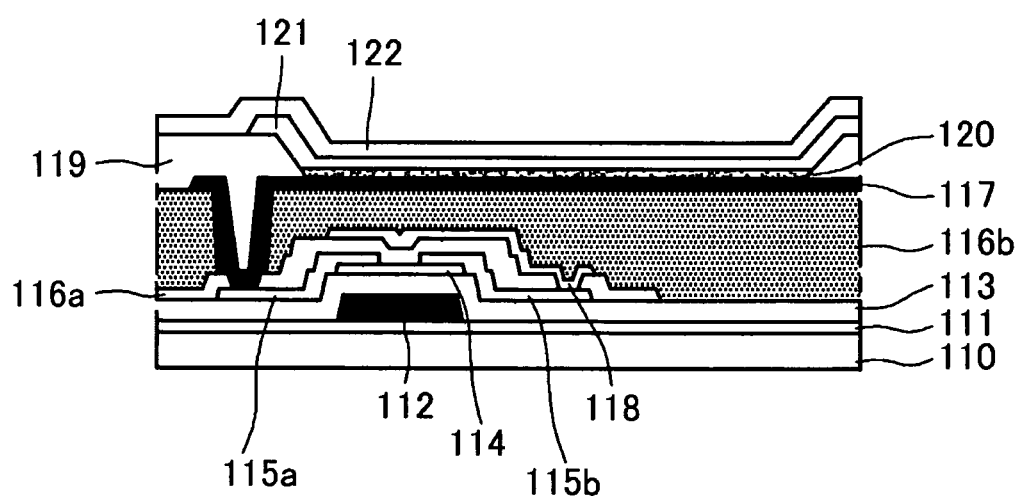
FIG. 2 is a schematic cross-sectional view of an organic light emitting display device according to an exemplary embodiment of the present invention.
Figure 3:
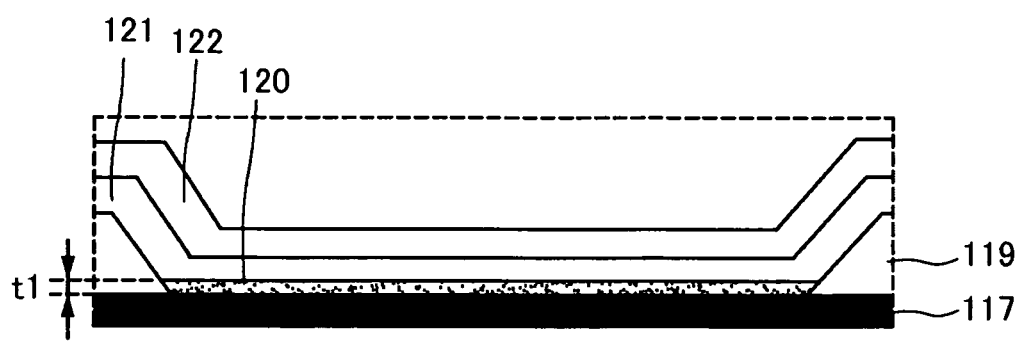
FIG. 3 is an enlarged view of a part of FIG. 2.

Referring to FIG. 2 and FIG. 3, a buffer layer is disposed on a substrate 110. The buffer layer 111 is formed to protect a transistor, which will be formed in a following process, from impurities such as alkali ion flow out from the substrate 110. The buffer layer 111 may be made of silicon oxide SiOx or silicon nitride SiNx.

A gate 112 may be disposed on the buffer layer. The gate 112 may be made of one selected from the group consisting of molybdenum Mo, aluminum Al, chrome Cr, gold Au, titanium Ti, nickel Ni, neodymium Nd, copper Cu, and alloy thereof. The gate 112 may be either a single layer or a multi-layer formed of at least two selected from the group consisting of molybdenum Mo, aluminum Al, chrome Cr, gold Au, titanium Ti, nickel Ni, neodymium Nd, copper Cu, and alloy thereof. The gate may be also a dual layer of molybdenum Mo/aluminum Al-neodymium Nd or molybdenum Mo/aluminum Al.

A first insulating layer 113 may be disposed on the gate 112. The first insulating layer 113 may be a single layer made of silicon oxide SiOx or silicon nitride SiNx, or may be a multilayer thereof. However, the first insulating layer 113 is not limited thereto.

An active layer 114 is disposed on the first insulating layer 113. The active layer 114 may include amorphous silicon or polycrystalline silicon which is crystallized amorphous silicon. Although it is not shown, the active layer 114 may include a channel area, a source area, and a drain area. Also, the active layer 114 may include an ohmic contact layer for reducing contact resistance.

A drain 115a and a source 115b may be disposed on the active layer 114. The drain 115a and the source 115b may be formed as a single layer or a multilayer. If the drain 115a and the source 115b are a single layer, the drain 115a and the source 115b may be made of one selected from the group consisting of molybdenum Mo, aluminum Al, chrome Cr, gold Au, titanium Ti, nickel Ni, neodymium Nd, copper Cu, and alloy thereof. If the drain 115a and the source 115b are a multilayer, the drain 115a and the source 115b may be a dual layer of Mo/AlNd or Mo/Al, or a triple layer of Mo/AlNd/Mo.

A second insulating layer 116a may be disposed on the drain 115a and the source 115b. The second insulating layer 116a may be a silicon oxide SiOx layer, a silicon nitride SiNx layer, or a multilayer thereof. However, the second insulating layer 116a is not limited thereto. The second insulating layer 116 may be a passivation layer.

The gate 112, the drain 115a, and the source 115b on the substrate 110 form a driving transistor. One of the drain 115a and the source 115b of the driving transistor may be connected to a shield metal 118 disposed on the second insulating layer 116a. The shield metal 118 prevents interference between source 115a and drain 115b of a transistor. The shield metal 118 may be omitted according to a transistor structure.

A third insulating layer 116b may be disposed on the second insulating layer 116a to improve evenness. The third insulating layer 116b may include organic material such as polyimide.

The transistor of bottom hate type formed on the substrate 110 was described, hereinbefore. However, not only a bottom gate type transistor but also a top gate type transistor may be formed on the substrate 110.

A cathode 117 may be disposed on the third insulating layer 116b. The cathode 117 may be connected to the drain 115a of the transistor and separately formed in each subpixel area. The cathode 117 may be made of opaque material having high reflection and low work function. However, the cathode 117 is not limited thereto.

Plasma pretreatment may be performed on a surface of the cathode 117. Gas used for the plasma pretreatment may include at least one of $O_2$, $N_2$, and Ar.

A bank layer 119 may be disposed on the cathode 117. The bank layer 119 includes an opening that exposes a part of the cathode 117. The bank layer 119 may include organic material such as benzocyclobutene (BCB) resin, acrylic resin, or polyimide resin.

A metal buffer layer 120 may be disposed on the cathode 117 exposed through the opening of the bank layer 119. The metal buffer layer 120 may be made of one of aluminum Al, silver Ag, calcium Ca, and magnesium Mg. However, the metal buffer layer 120 is not limited thereto. The metal buffer layer 120 may be made of any metal material that can improve electron injection efficiency.

The metal buffer layer 120 may be formed on the cathode 117 at a thickness of about 1 Å~50 Å. If the metal buffer layer 120 is formed thicker than about 1 Å, surface uniformity is improved as well as electron injection efficiency. If the metal buffer layer 120 is formed thinner than about 50 Å, electron injection efficiency is improved within a range that does not degrade the usability of pixilation. Also, a color coordinate can be improved thereby. Furthermore, the metal buffer layer 120 prevents the oxidation of the cathode 117.

An organic light emitting layer 121 may be disposed on the metal buffer layer 120. The organic light emitting layer 121 may be formed to emit one of red, green, and blue light according to a corresponding subpixel. There may be a further subpixel may emitting white light, according to the structure of the organic light emitting layer 121.

An anode 122 may be disposed on the organic light emitting layer 121. The anode 122 may be made of transparent material such as Indium Tin Oxide (ITO), Indium Zinc Oxide (IZO), Indium Tin Zinc Oxide (ITZO), or $Al_2O_3$ doped with ZnO (AZO). However, the anode 122 is not limited thereto.

Figure 4:
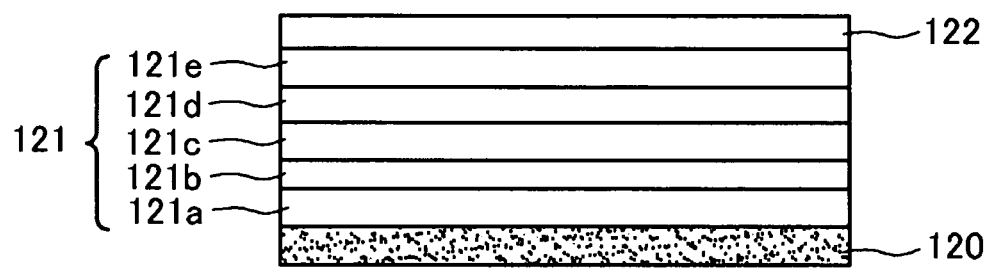
FIG. 4 is a diagram illustrating a stacking structure of an organic light emitting layer.

Referring to FIG. 4, the organic light emitting layer 121 may be disposed between the metal buffer layer 120 and the anode 122. The organic light emitting layer 121 may include an electron injection layer 121a, an electron transport layer 121b, an emission layer 121c, a holes transport layer 121d, and a hole injection layer 121e.

The electron injection layer 121a makes the injection of electron smooth and may be made of tris(8-hydroxyquinolino)aluminum ($Alq_3$), PBD, TAZ, spiro-PBD, BAlq, LiF, or SAlq. However, the electron injection layer 121a is not limited thereto.

The electron transport layer 121b makes the transport of electrons smooth and may be made of Alq3(tris(8-hydroxyquinolino)aluminum), PBD, TAZ, spiro-PBD, BAlq, LiF, or SAlq. However, the electron transport layer 121b is not limited thereto.

The emission layer 121c may include material that emits red, green, or blue light. Also, the emission layer 121c may be made of phosphorescent or fluorescent material. However, the emission layer 121c is not limited thereto.

If the emission layer 121c emits red light, the emission layer 121c may be made of phosphorescent material including host material having carbazole biphenyl (CBP) or 1,3-bis (carbazol-9-yl) mCP, and dopant having at least one of the group consisting of PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), and PtOEP(octaethylporphyrin platinum). Also, the emission layer 121c may be made of fluorescent material having PBD:Eu(DBM)3(Phen) or Perylene. However, the phosphorescent material and fluorescent material are not limited thereto.

If the emission layer 121c emits green light, the emission layer 121c may be made of material including a phosphorescent material having host material having CBP or mCP and dopant material having Ir(ppy)3(fac tris(2-phenylpyridine) iridium). Unlikely, the emission layer 121c may be made of a fluorescent material having Alq3(tris(8-hydroxyquinolino) aluminum). However, the phosphorescent material and fluorescent material are not limited thereto.

If the emission layer 121c emits blue light, the emission layer 121c may made of phosphorescent material including host material CBP or mCP and dopant material having (4,6-F2ppy)2Irpic. Unlikely, the emission layer 121c may be made of fluorescent material having one selected from the group consisting of spiro-DPVBi, spiro-6P, distryrylbenzene (DSB), distyryl arylene (DSA), PFO polymer, and PPV polymer. However, the emission layer 121c is not limited thereto. However, the phosphorescent material and fluorescent material are not limited thereto.

The hole transport layer 121d makes the transport of holes smooth. The hole transport layer 121d may be made of one selected from the group consisting of NPD(N,N-dinaphthyl-N,N'-diphenyl benzidine), TPD(N,N'-bis-(3-methylphenyl)-N,N'-bis-(phenyl)-benzidine), s-TAD, and MTDATA(4,4',4"-Tris(N-3-methylphenyl-N-phenyl-amino)-triphenylamine). However, the hole transport layer 121d is not limited thereto.

The hole injection layer 121e makes the injection of holes smooth. The hole injection layer 121e may be made of one selected from the group consisting of CuPc(cupper phthalocyanine), PEDOT(poly(3,4)-ethylenedioxythiophene), PANI (polyaniline), and NPD(N,N-dinaphthyl-N,N'-diphenyl benzidine). However, the hole injection layer 121e is not limited thereto.

Here, the embodiment of the present invention is not limited to FIG. 4. At least one of the electron injection layer 121a, the electron transport layer 121b, the hole transport layer 121d, and the hole injection layer 121e may be omitted.

Hereinafter, a method for manufacturing an organic light emitting display device according to an embodiment of the present invention will be described.

Figure 5:
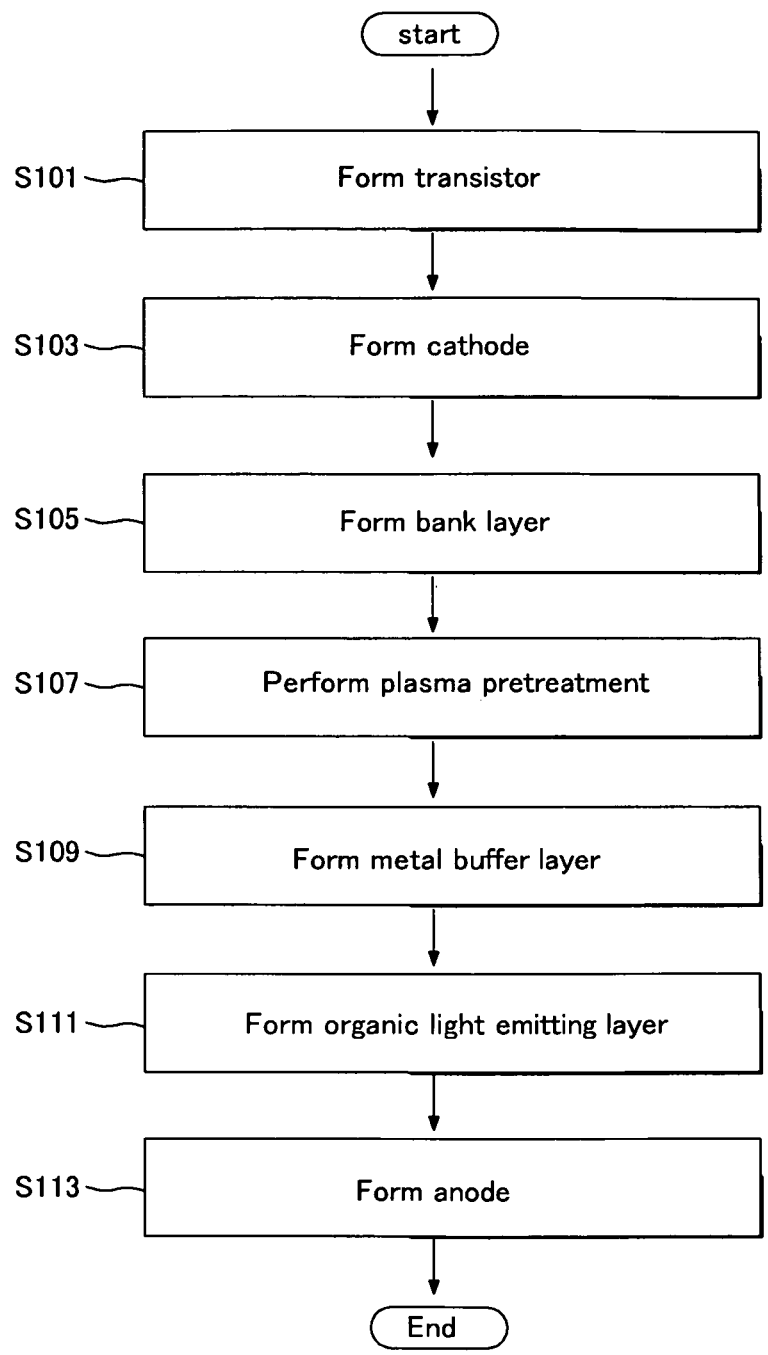
FIG. 5 is a flowchart of a method for manufacturing an organic light emitting display device according to an exemplary embodiment of the present invention.
Figure 6:
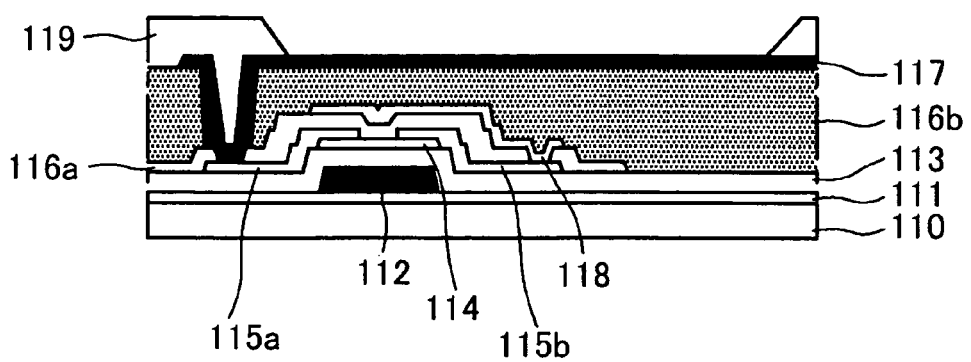
FIG. 6 to FIG. 10 are diagrams for describing a method for manufacturing an organic light emitting display device according to an exemplary embodiment of the present invention.

As shown in FIG. 5 and FIG. 6, a transistor is formed on a substrate 110 at step S101 as follows.

A substrate 110 is prepared. A substrate made of material having excellent mechanical strength or superior dimensional stability may be selected in order to form elements thereon. For example, the substrate 110 may be made of a glass plate, a metal plate, a ceramic plate, or a plastic plate (polycarbonate resin, acryl resin, vinyl chloride resin, polyethylene terephthalate resin, polyimide resin, polyester resin, epoxy resin, silicon resin, and fluorine resin.

A buffer layer 111 is formed on the substrate 110. Then, a gate 112 is formed on the buffer layer 111. The gate 112 may be a single layer or a multilayer.

A first insulating layer 113 is formed on the gate 112. The first insulating layer 113 may be a silicon oxide (SiOx) layer, a silicon nitride (SiNx) layer, or a multilayer thereof. However, the first insulating layer 113 is not limited thereto.

An active layer 114 is formed on the first insulating layer 113. The active layer 114 may include amorphous silicon or polycrystalline silicon that is crystallized amorphous silicon. Although it is not shown, the active layer 114 may include a channel area, a source area, and a drain area. Also, the active layer 114 may include an ohmic contact layer for reducing contact resistance.

A drain 115a and a source 115b are formed on the active layer 114. The drain 115a and the source 115b may be formed as a single layer or a multilayer.

A second insulating layer 116a is formed on the drain 115a and the source 115b. The second insulating layer 116a may be a single layer made of silicon oxide (SiOx) or silicon nitride (SiNx), or may be a multiplayer thereof. However, the second insulating layer 116 is not limited thereto. The second insulating layer 116a may be a passivation layer.

In order to improve evenness, a third insulating layer 116b is formed on the second insulating layer 116a. The third insulating layer 116b may include organic material such as polyimide.

Hereinbefore, the transistor of bottom gate type formed on the substrate 110 was described as a bottom gate type transistor. However, not only the bottom gate type transistor but also a top gate type transistor may be formed on the substrate 110. Meanwhile, the gate 112, the drain 115a, and the source 115b formed on the substrate 110 form a driving transistor. One of the drain 115a and the source 115b of the driving transistor may be connected to a shield metal 118 formed on the second insulating layer 116a.

As shown in FIG. 5 and FIG. 6, a cathode is formed on the transistor to be connected to the drain 115a or the source of the transistor at step S103 as follows.

The cathode 117 is formed on the third insulating layer 116b of the transistor to be connected to the drain 115a of the transistor and to be isolated at each subpixel area. The cathode 117 may be made of opaque material having high reflection such as aluminum Al, aluminum alloy (Al alloy) or silver (Ag). However, the cathode 117 is not limited thereto.

As shown in FIG. 5 and FIG. 6, a bank layer 119 having an opening is formed on the cathode 117 at step S105 as follows.

The bank layer 119 is formed on the cathode 117. The bank layer 119 includes an opening that exposes a part of the cathode 117. The bank layer 119 may include organic material such as benzocyclobutene (BCB) resin, acryl resin, or polyimide resin.

Figure 7:
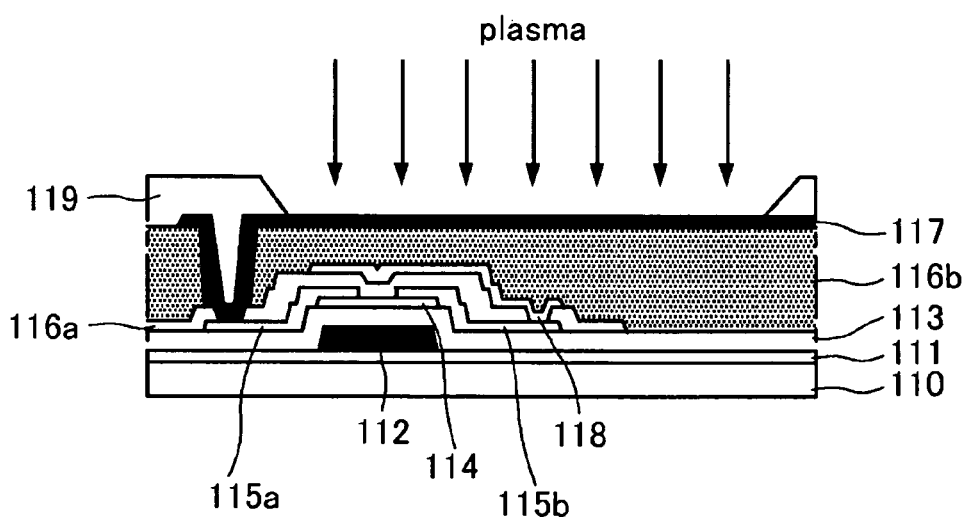

As shown in FIG. 5 and FIG. 7, plasma pretreatment is performed on the cathode 117 at step S107 as follows.

The surface of the cathode 117 is pretreated using plasma. A plasma gas for pretreatment includes at least one of oxygen $O_2$, nitrogen $N_2$, and argon Ar. The plasma pretreatment removes an oxide layer that is naturally formed on the surface of the cathode 117 and also suppresses the oxidation of the cathode surface.

Figure 8:
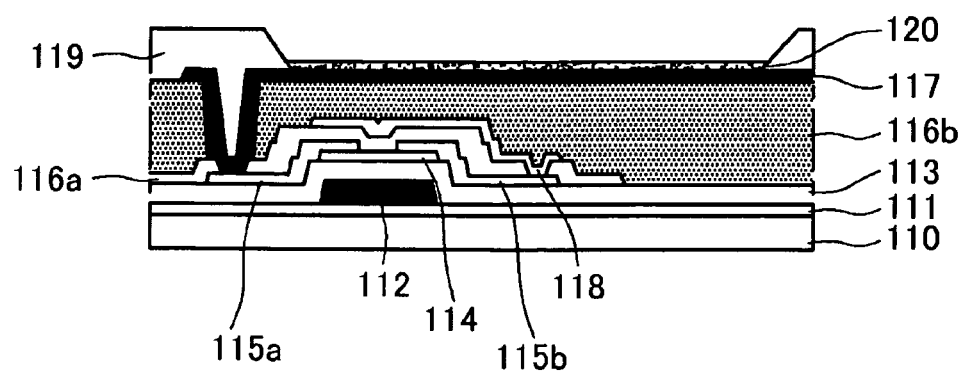

As shown in FIG. 5 and FIG. 8, a metal buffer layer 120 is formed on the cathode 117 at step S109 as follows.

The metal buffer layer 120 is formed on the cathode 117 exposed through the opening of the bank layer 119. The metal buffer layer 120 may be made of one of aluminum Al, silver Ag, calcium Ca, and magnesium Mg. However, the metal buffer layer 120 is not limited thereto. The metal buffer layer 120 may be made of any metal material that improves electron injection efficiency.

The metal buffer layer 120 may be formed on the cathode 117 at a thickness of about 1□~50□. If the metal buffer layer 120 is formed thicker than about 1 □, surface uniformity is improved as well as electron injection efficiency. If the metal buffer layer 120 is formed thinner than about 50□, electron injection efficiency is improved within a range that does not degrade the usability of pixilation. Also, a color coordinate can be improved. Furthermore, the metal buffer layer 120 prevents the oxidation of the cathode 117.

Meanwhile, the plasma pretreatment S107 and the metal buffer layer formation S109 can be consecutively performed in the same chamber. Therefore, a yield rate can be improved.

Figure 9:
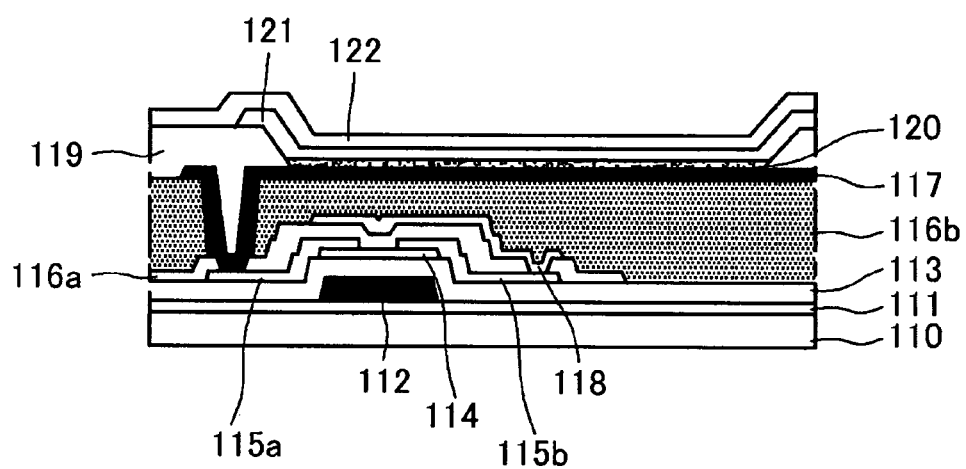

As shown in FIG. 5 and FIG. 9, an organic light emitting layer 121 is formed on the metal buffer layer 120 at step S111 as follows.

The organic light emitting layer 121 is formed on the metal buffer layer 120. The organic light emitting layer 121 is formed to emit one of red, green, and blue light according to a corresponding subpixel. There may be a further subpixel emitting white light, according to the structure of the organic light emitting layer 121.

As shown in FIG. 5 and FIG. 9, an anode 122 is formed on the organic light emitting layer 121 at step S113 as follows.

The anode 122 is formed on the organic light emitting layer 121. The anode 122 may be made of transparent material such as Indium Tin Oxide (ITO), Indium Zinc Oxide (OZO), Indium Tin Zinc Oxide (ITZO), or $Al_2O_3$ doped with ZnO (AZO).

Figure 10:
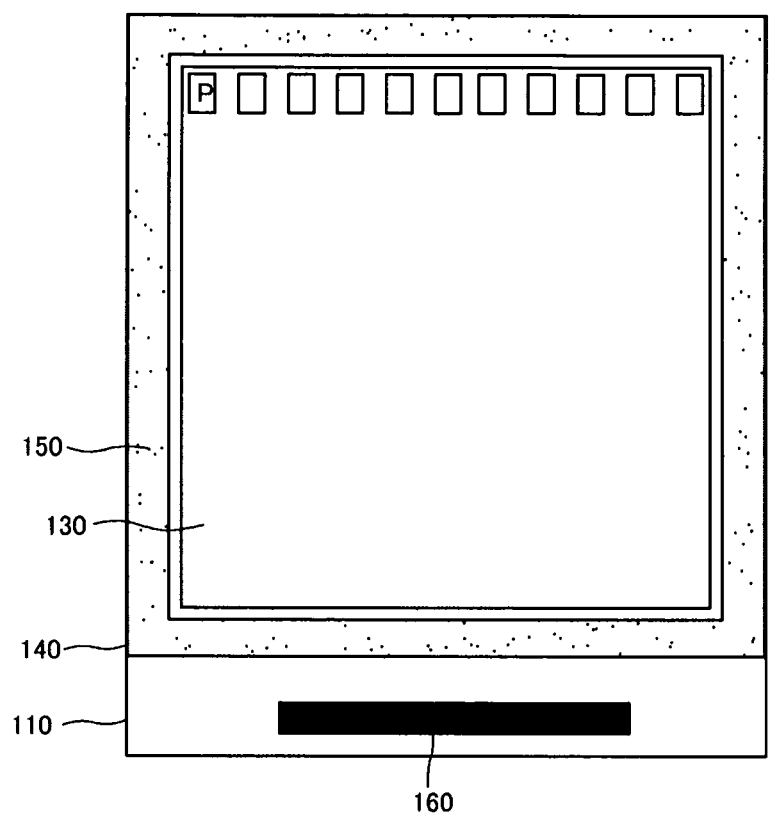

After performing the above described processes, a display unit 130 having a plurality of subpixels P arranged on the substrate 110 in matrix as shown in FIG. 10 is formed. The plurality of subpixels P in the display unit 130 may include a transistor and an organic light emitting diode as described above.

Meanwhile, the plurality of subpixels P formed on the display unit 130 on the substrate 110 are very weak to moisture and oxygen. Therefore, a sealing substrate 140 is prepared, an adhesive member 150 is formed at an outer ring of the substrate 110 of the display unit 130, and the substrate 110 and the sealing substrate 140 are sealed together.

After sealing, a driving unit 160 having a data driver and a scan driver may be formed on the substrate 110, and the driving unit 160 on the substrate may be connected to an external substrate. Although the driving unit 160 is schematically shown for convenience, at least one of the data driver and the scan driver of the driving unit 160 may be formed on the external substrate.

The organic light emitting display device manufactured by the method according to the present embodiment can display images by controlling the plurality of subpixels P to emit light if a driving signal is applied through the driving unit 160.

The organic light emitting display device according to the present embodiment includes the metal buffer layer formed on the cathode to prevent the oxidation of the cathode and to improve electron injection efficiency. Therefore, the organic light emitting display device according to the present embodiment has improved reliability and extended life-span. Also, the method of manufacturing an organic light emitting display device according to the embodiment of the present invention consecutively performs a process of preprocessing the surface of the cathode and a process of forming the metal buffer layer. Therefore, a yield rate can be improved.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method for manufacturing an organic light emitting display device, comprising:
    forming a transistor on a substrate;
    forming a first insulation layer on the transistor;
    forming a metal shield layer on the first insulation layer, the metal shield layer directly on and physically contacting one of a source electrode and a drain electrode of the transistor;
    forming a second insulation layer on the metal shield layer;
    forming a cathode on the second insulation layer to be directly connected to the another one of the source electrode and the drain electrode of the transistor;
    after forming the cathode, forming a bank layer having an opening on the cathode;
    performing plasma pretreatment on the cathode to remove an oxide layer that is naturally formed on a surface of the cathode and to suppress an oxidation of the surface of the cathode;
    forming a metal buffer layer directly on and physically contacting the cathode at the opening of the bank layer to prevent the oxidation of the cathode and to improve electron injection efficiency;
    forming an organic light emitting layer directly on and contacting the metal buffer layer; and
    forming an anode on the organic light emitting layer,
    wherein a thickness of the metal buffer layer is approximately 1 Å to 50 Å,
    wherein in said performing plasma pretreatment, one of nitrogen plasma and argon plasma is used,
    wherein said performing plasma pretreatment and said forming the metal buffer are consecutively performed in an identical chamber.

* * * * *